United States Patent
Fischer et al.

(12) 
(10) Patent No.: US 6,477,106 B2
(45) Date of Patent: Nov. 5, 2002

(54) CIRCUIT CONFIGURATION FOR DEACTIVATING WORD LINES IN A MEMORY MATRIX

(75) Inventors: Helmut Fischer, Taufkirchen; Joachim Schnabel, München, both of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/925,170

(22) Filed: Aug. 8, 2001

(65) Prior Publication Data

US 2002/0027827 A1 Mar. 7, 2002

(30) Foreign Application Priority Data

Aug. 8, 2000 (DE) .......................... 100 38 665

(51) Int. Cl.[7] ................................................. G11C 7/00
(52) U.S. Cl. .............................. 365/230.06; 365/230.01
(58) Field of Search ....................... 365/189.01, 230.01, 365/230.03, 230.06

(56) References Cited

U.S. PATENT DOCUMENTS

| | | | |
|---|---|---|---|
| 6,038,191 A | * | 3/2000 | Fukuhara et al. ........... 365/229 |
| 6,046,956 A | | 4/2000 | Yabe |
| 6,324,110 B1 | * | 11/2001 | Leung et al. ................ 365/207 |
| 2002/0015344 A1 | * | 2/2002 | Leung et al. ................ 365/207 |

* cited by examiner

*Primary Examiner*—Viet Q. Nguyen
(74) *Attorney, Agent, or Firm*—Laurence A. Greenberg; Werner H. Stemer; Ralph E. Locher

(57) ABSTRACT

A circuit configuration for deactivating word lines in a memory matrix. The circuit configuration contains controllable connection devices for connecting the relevant word line to a common supply line system carrying the deactivation potential for the word lines. The circuit configuration contains a control circuit that, in response to a deactivation command, produces a deactivation control signal that turns on the controllable connection devices. A reduction device is provided which can be switched on selectively and which, when switched on, limits the currents flowing through the turned-on connection devices to such an extent that the total current flowing via the supply line system does not exceed a prescribed value.

10 Claims, 1 Drawing Sheet

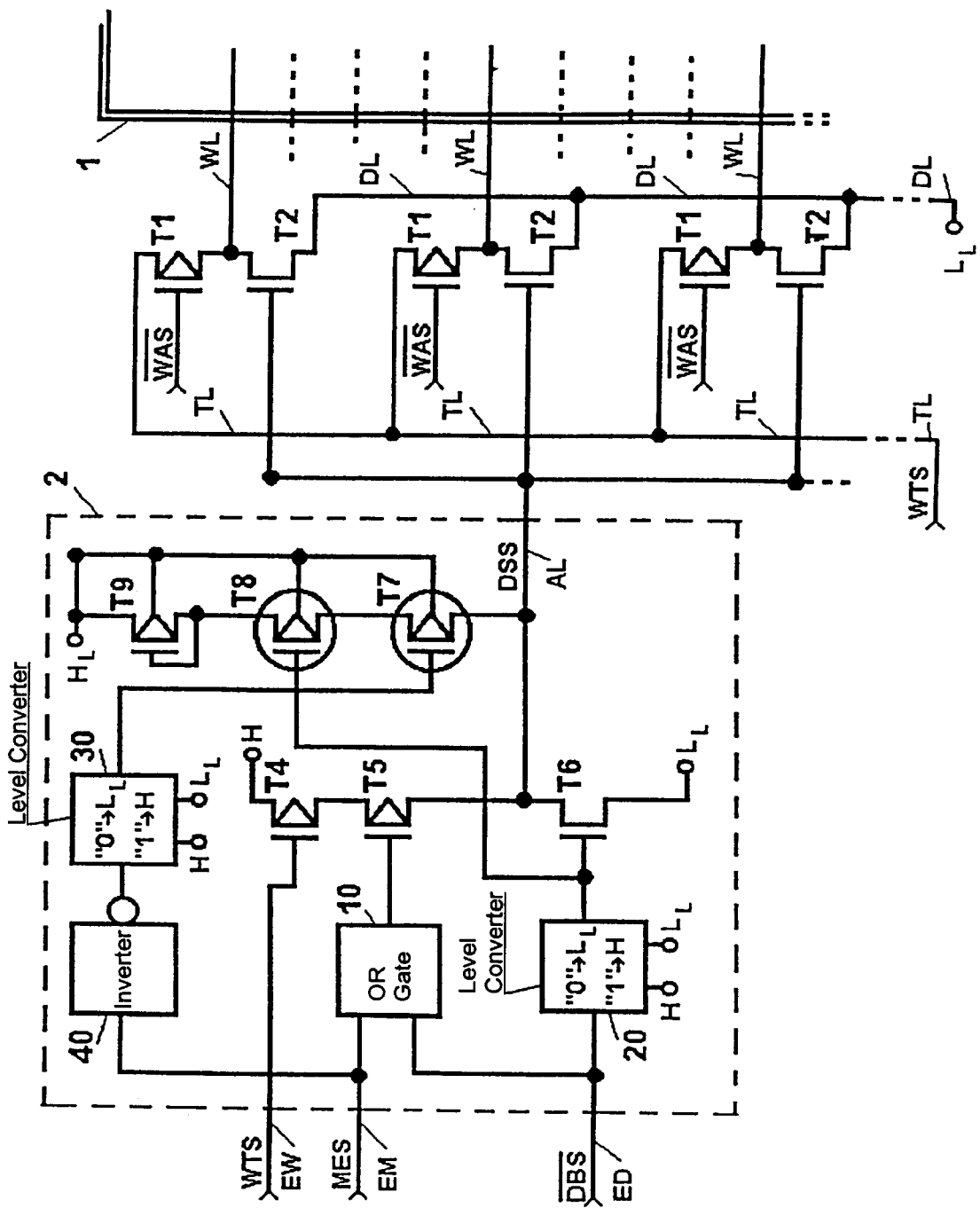

CIRCUIT CONFIGURATION FOR DEACTIVATING WORD LINES IN A MEMORY MATRIX

BACKGROUND OF THE INVENTION

Field of the Invention

The invention relates to a circuit configuration for deactivating word lines in a memory matrix. Each of the word lines is connected to a controllable connection device for connecting the relevant word line to a common supply line system carrying a deactivation potential for the word line. A control circuit which in response to the deactivation command, produces a deactivation control signal that turns on the controllable connection device.

In normal digital information memories, the memory cells form a matrix of rows and columns. To select a memory cell for the purposes of writing or reading, a word line associated with the relevant row is activated and a bit line associated with the relevant column is driven. The selected activation of the word lines, that is to say the "addressing" of the rows in the matrix, is normally performed by a row address decoder which has outputs individually connected to the word lines and inputs for receiving the bits of a digital row address.

Similarly, the selective driving of the bit lines is performed by a column address decoder.

A word line is activated by applying an activation potential which conditions the switching transistors of the associated memory cells such that the charges stored in the memory cells are transferred to the respective bit lines. The activation potential is applied by the row address decoder that selects the respective word line to be activated.

Once the read or write operation has been performed, the word line is deactivated again by bringing it to a deactivation potential which turns off the cell transistors. The deactivation potential is applied by the row address decoder by turning on a connection device that is individually associated with the relevant word line and connects the relevant word line to a supply line system carrying the potential relating thereto. The connection device is normally a transistor switch that is turned on fully in response to a deactivation command.

In some tests carried out on memory matrices for the purposes of a checking operation, word lines are temporarily activated and subsequently deactivated without performing a write or read operation during activation. The test activation can be used, for example, to detect a risk of leakage currents, in particular when, in this context, the activation is maintained over a relatively long period and/or is carried out using a slightly increased activation potential. Such leakage currents can flow, by way of example, from the activated word lines to memory cells on adjacent unactivated word lines. Any leakage currents arising therefore influence the charge state of memory cells on unactivated word lines, which can be established by subsequently checked the memory contents thereof. To save test time, the test activation is preferably carried out on a plurality of word lines at the same time, specifically using such a selection that the activated word lines have unactivated exemplars adjacent to them. This "multiple word line select", which can be pre-programmed in the row address decoder, should, by way of example, contain the selection of each fourth word line for activation, while the word lines situated in between are kept inactive.

When a plurality of active word lines are deactivated at the same time, the discharge currents flowing via the associated deactivation transistors add up to form a relatively high total current which burdens the network carrying the deactivation potential. In this context, the network primarily contains the inactive word lines and wiring in the row address decoder, which wiring is relatively narrow for space reasons, and thus has a relatively high resistance, and also distributes the deactivation potential to associated connections of other elements of the decoder. As a result of the high resistance of the metallized area forming the wiring, the simultaneous deactivation of the active word lines produces a resistive voltage drop across the network, which voltage drop burdens the other, inactive word lines, most severely the directly adjacent exemplars. In this case, a relatively large voltage elevation occurs which is proportional to the number of active word lines and is thus proportional to the time saving aimed for. The voltage elevation that occurs causes a reduction in the blocking effect of the associated cell transistors in the affected word lines, and this can erase some or all of the information in connected cells.

To prevent this risk, the number of word lines which are respectively selected at the same time for the multiple word line select has been kept down to date. In consequence, however, a longer test time was needed. One alternative would be to configure the deactivation potential network to have a very low resistance, but this would require wider metallized areas and is undesirable for space reasons.

SUMMARY OF THE INVENTION

It is accordingly an object of the invention to provide a circuit configuration for deactivating word lines in a memory matrix that overcomes the above-mentioned disadvantages of the prior art devices of this general type, which permit even a relatively large number of active word lines on a memory matrix to be deactivated at the same time and without perturbing accompanying effects.

With the foregoing and other objects in view there is provided, in accordance with the invention, a circuit configuration for deactivating word lines in a memory matrix of a memory. The circuit configuration contains a common supply line system carrying a deactivation potential for the word lines, and controllable connection devices connected to the common supply line and to be connected to the word lines. The controllable connecting devices connect each of the word lines to the common supply line system carrying the deactivation potential for the word lines. A control circuit is provided and has an output connected to the controllable connection devices. The control circuit receives a deactivation command and in response to the deactivation command produces a deactivation control signal available at the output. The deactivation control signal turns on the controllable connection devices resulting in turned-on controllable connection devices. The control circuit has a reduction device connected to the output and the reduction device can be switched on selectively and which, when switched on, limits currents flowing through the turned-on controllable connection devices to such an extent that a total current flowing through the common supply line system does not exceed a prescribed value.

Accordingly, the invention is implemented on a circuit configuration for deactivating the word lines in the memory matrix. Each of which has the controllable connection device for connecting the relevant word line to the common supply line system carrying the deactivation potential for the word lines. The control circuit is provided which, in response to a deactivation command, produces a deactivation control signal that turns on the controllable connection devices. According to the invention, the control circuit contains a reduction device which can be switched on selectively and which, when switched on, limits the currents flowing through the turned-on connection devices to such an extent that the total current flowing via the supply line system does not exceed a prescribed value.

The inventively provided reduction device permits large currents in the supply line system carrying the deactivation potential, and hence the aforementioned voltage elevations normally to be dreaded when the word lines are deactivated at the same time, to be reduced or prevented entirely. It is thus possible to carry out tests in the multiple word line select using far more word lines than previously, and thus to shorten the total test time on the memory matrix.

The desired current limiting can be achieved by changing the ratio of the effective resistances of the word line connection device and the deactivation potential supply line system. By increasing the size of the resistance of the connection devices between the word line and the deactivation potential supply line system, the discharge current of the active word lines is better distributed over all the inactive word lines. Accordingly, one advantageous embodiment of the inventive reduction device contains means for increasing the electrical resistance of the connection devices.

This means may provide each connection device with a series resistor that is normally bridged and is activated only when a plurality of active word lines is intended to be deactivated at the same time. However, this requires a multiplicity of additional components and interconnections. A more elegant path can be taken if each connection device contains, as is known per se, a deactivation transistor whose primary current path is situated between the relevant word line and the supply line system and whose control electrode receives the deactivation control signal. In this case, the increase in the size of the electrical resistance of the connection device can be achieved by reducing the voltage swing for the deactivation control signal, that is to say by reducing the amplitude of the signal, which turns on the transistor. In addition or as an alternative, the inventive reduction device may contain means for extending the rise time of the deactivation control signal. This likewise achieves current limiting, because high discharge current peaks are prevented, such as otherwise arise when the deactivation control signal has a high edge gradient.

In accordance with an added feature of the invention, each of the controllable connection devices have a deactivation transistor with a primary current path connected between one of the word lines and the common supply line system. The deactivation transistor has a control electrode connected to the output of the control circuit and the control electrode receives the deactivation control signal. The reduction device has means for reducing an amplitude of the deactivation control signal.

In accordance with an additional feature of the invention, the reduction device has means for reducing a gradient of a leading edge of the deactivation control signal.

In accordance with another feature of the invention, a first terminal for receiving a first potential, a second terminal for receiving a second potential, and a third terminal for receiving a third potential are provided. A first current path is connected between the first terminal and the output.

The first current path, only when it is on, connects the control electrode of the deactivation transistor to the first potential which turns off the deactivation transistor. A second current path is connected between the output and the second terminal. The second current path, only when it is on, connects the control electrode of the deactivation transistor to the second potential which drives the deactivation transistor to saturation. A third current path is connected between the output and the third terminal. The third current path, only when it is on, connects the control electrode of the deactivation transistor to the third potential for biasing the deactivation transistor in a forward direction. The third current path contains the means for reducing the amplitude and the means for reducing the gradient of the leading edge of the deactivation control signal.

In accordance with a further feature of the invention, the means for reducing the amplitude of the deactivation control signal adjusts the third potential by a given value resulting in the deactivation control signal that biases the deactivation transistor in a state having limited conductivity.

In accordance with a further added feature of the invention, the third current path contains a diode or a transistor wired up as a diode having a threshold voltage that is subtracted, when the third current path is on, from the third potential.

In accordance with a further additional feature of the invention, the means for reducing the gradient of the leading edge of the deactivation control signal includes at least one element having a perceptible non-reactive resistance that forms part of the third current path.

In accordance with another further feature of the invention, the element with the non-reactive resistance is a primary current path of a transistor which is turned on in order to switch on the third current path.

In accordance with a concomitant feature of the invention, the control circuit has a first input for applying a mode setting signal, a second input for applying a binary command signal, and a logic combination device connected to the first input, the second input, the first current path, the second current path and the third current path. The logic combination device keeps only the first current path switched on whenever and only when the binary command signal has a first binary value. The logic combination device keeps the second current path switched on whenever and only when the binary command signal has a second binary value and the mode setting signal has a particular binary value. The logic combination device switches on only the third current path whenever and only when the binary command signal has the second binary value and the mode setting signal has the binary value other than the particular binary value.

Other features which are considered as characteristic for the invention are set forth in the appended claims.

Although the invention is illustrated and described herein as embodied in a circuit configuration for deactivating word lines in a memory matrix, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a block circuit diagram of a preferred embodiment of a memory circuit and control circuit according to the invention.

DESCRIPTION OF THE PREFERRED EMBODIMENTS

Referring now in detail to the signal FIGURE of the drawing, there is shown in the right-hand side a part of an edge of a memory matrix 1, to which edge individual word lines WL lead. Normally, the word lines WL are organized in interleaved groups, with the word lines WL in different groups succeeding one another cyclically as seen in the column direction. In the case described here, there are four groups, and the drawing shows in more detail only the first three word lines WL of a first group, which form the first, the fifth and the ninth word line in the total sequence. The other three word lines of a group are situated in between and are indicated merely by dashed lines.

The memory matrix 1 forms one of a plurality of segments of a memory module. The segments themselves and the word lines WL within each segment can be driven selectively by a row address decoder which contains, among other things, the circuit which is shown. The decoder also contains sources or supply lines for providing stipulated and clearly distinguishable electrical potentials. These include the potentials representing the levels "low" (L level, e.g. 0 Volts) and "high" (H level, e.g. +2.0 Volts) for defining the binary or logic values "0" and "1", and also further potentials, which are mentioned in more detail below. It may be assumed that the H level corresponds to a logic "1" and is positive with respect to the L level, which corresponds to a logic "0".

Each word line WL can be driven to an activation potential using a respective first word line transistor T1, referred to as activation transistor below. In the case described here, the potential is assumed to be the H level, which conditions the cell transistors (not shown), connected to the word line, of the memory matrix 1 such that they transfer the charges stored in the memory cells to the respective bit lines. Each of the activation transistors T1 is a field effect transistor having a P-channel (P-FET), preferably of MOS construction, whose channel is used to put the relevant word line at H level when its gate electrode receives a word line selection signal /WAS at L level from the address decoder. The H level is supplied to the channels of all the activation transistors T1 associated with the respective same group of word lines via a common driver line TL, as a binary state of a word line driver signal WTS which is brought to the H level by the address decoder when a word line is to be activated on the relevant group.

In addition, each of the word lines WL is connected by a second word line transistor T2, referred to as a deactivation transistor below, to a supply line DL which is connected to a source of a deactivation potential $L_L$. This potential is preferably a level that is even "lower" (more negative) than the L level (e.g. −0.3 Volts), in order to ensure that the cell transistors of the memory matrix 1 that are connected to the word line WL are turned off. The deactivation transistor T2 is a field effect transistor having an N-channel (N-FET), preferably of MOS construction.

To activate the word lines WL of a group, the address decoder brings the word line driver signal WTS to H level and controls the word line selection signal /WAS for the word line exemplars which are to be activated to L level. The associated activation transistors T1 thus turn on, and the relevant word lines are driven to H level. Before the activation and after the end of activation, the signal WTS is held at L level. The control circuit used for this purpose is not shown in the drawing.

The drawing shows in more detail only the control circuit used to deactivate the word lines WL of the first group, which control circuit is denoted overall by the reference numeral 2 in the drawing. Such a control circuit is likewise provided for each of the other three word line groups. The control circuit 2 has an output line AL that is connected to gate electrodes of all the deactivation transistors T2 in order to supply a deactivation control signal DSS for turning on these transistors. A first input line EW is connected to receive the word line driver signal WTS, a second input line EM is connected to receive a mode setting signal MES and a third input line ED is connected to receive a deactivation command signal DBS.

Connected to the output line AL are three different control current paths. A first path is routed via a channel of an NFET T6 to the $L_L$ potential. A second path contains two P-FETs T4 and T5, whose channels are connected in series between the output line AL and a potential source for H level. The FETs T4 and T5 are switching transistors which, when on, have no significant electrical resistance. A third path contains, in a series circuit, the channels of two P-FETs T7 and T8 and a P-FET T9 wired up as a diode, and is routed to the source of a potential $H_L$ which is slightly more negative than the H level but is more positive than the L level.

A gate electrode of the P-FET T4 is connected to the input line EW. A gate electrode of the P-FET T5 is connected to the output of an OR gate 10 which has two inputs, the first of which is connected to the input line EM and the second of which is connected to the input line ED. The gate electrodes of the N-FET T6 and of the P-FET T8 are connected to the output of a level converter 20 whose signal input is connected to the input line ED. The gate electrode of the P-FET T7 is connected to the output of a level converter 30 whose signal input is connected to the input line EM via an inverter 40. The level converters 20 and 30 are identical to one another and are of a known configuration, in order for their output to supply the H level when their signal input has the binary value "1" and to supply the $L_L$ level when their signal input has the binary value "0".

The control circuit 2 can be switched over between two modes of operation, which are referred to below as a "normal mode" and a "test mode". Changeover is effected using the mode setting signal MES, which is set to "0" (L level) for the normal mode and is set to "1" (H level) for the test mode. The two modes are described below.

Normal Mode

In the normal mode, the control circuit 2 works in the normal way to bring the output line AL abruptly to H level when a word line deactivation command is received on the input line ED, and thereby drives the deactivation transistors T2 to saturation with a steep rising edge, so that the deactivation transistors T2 discharge the connected word lines WL to the $L_L$ level as quickly as possible via the supply line DL.

The normal mode is set when, in the operation of the memory matrix 1, only a respective single word line WL has been activated by L level of the associated word line selection signal /WAS and is to be deactivated. For this purpose, the mode setting signal MES is held at "0". When word line activation is ended, the signal WTS received on the input line EW is switched, as mentioned, to L level. This conditions the P-FET T4 to being turned on.

In the absence of a deactivation command, the signal DBS at the command input ED is at "1", which results in that the level converter 20 couples the H level to the gate electrode of the N-FET T6. The N-FET T6 is thus on and holds the output line AL at $L_L$ level, so that the word line deactivation transistors T2 are kept off. The P-FET T5 still remains off for the time being, because its gate electrode receives H level ("1") from the output of an OR gate 10, since one of the two inputs of the latter receives the "1" from the command input ED. The P-FET T7 is turned off by the output signal from the level converter 30, which is at H level, because a "1" appears as the input of this level converter (inverted "0" of the mode setting signal). The P-FET T8 is turned off by the H level from the output of the level converter 20.

The deactivation command is applied by a change of the signal DBS from "1" to "0" (the signal DBS is an "active low" signal in the case described here, as indicated by a bar over the letter group DBS in the drawing). The level converter 20 converts the "0" appearing at the input ED to $L_L$ level, so that the N-FET T6 turns off, which disconnects the $L_L$ potential from the output line AL. In addition, the output of the OR element 10, which receives the signals MES and DBS, changes to L level ("0", because its two inputs are now at "0". This also causes the P-FET T5 to turn on, and thus produces a low resistance connection between the output line AL and the H potential. The result of this low-resistance state is that the potential of the output line AL immediately rises to full H level abruptly.

Thus, in response to the deactivation command /DBS, a deactivation control signal DSS with a steep edge is produced on the line AL, which deactivation control signal turns on the word line deactivation transistors T2 as desired quickly and fully to the saturation point in order to discharge the activated word line WL to $L_L$ potential as quickly as possible.

Test Mode

The test mode is set when the multiple word line select is used for testing the memory matrix 1, in which case a respective plurality of the word lines WL have been activated by L level of the signal /WAS on a plurality of transistors T1 and is to be deactivated together. To this end, the mode setting signal MES is set to "1". When the word line activation is ended, the signal WTS received on the input line EW is switched, as mentioned, to L level. This conditions the P-FET T4 to being turned on.

Before the appearance of the deactivation command, the signal DBS on the command input ED is still at "1", which results in that the level converter 20 couples the H level to the gate electrode of the N-FET T6. The N-FET T6 is thus on and keeps the output line AL at $L_L$ level, so that the word line deactivation transistors T2 are kept off. In the test mode of the control circuit, the P-FET T5 remains permanently off, because its gate electrode receives H level ("1") from the output of the OR gate 10, since one of the two inputs of the latter receives the "1" from the input line MES during the test mode. The P-FET T7 is turned on for the duration of the test mode by the output signal from the level converter 30, which signal is now at $L_L$ level, because a "0" appears at the input of this level converter (inverted "1" of the mode setting signal). The H level from the output of the level converter 20 keeps the P-FET T8 off for the time being.

If the deactivation command is now applied, as a result of the signal DBS changing from "1" to "0", the level converter 20 converts this "0" to $L_L$ level at its output, so that the N-FET T6 turns off, which disconnects the $L_L$ potential from the output line AL. The $L_L$ potential from the output of the level amplifier 20 now turns on the P-FET T8, so that a conductive connection between the output line AL and the $H_L$ potential is produced by the transistor T8, the P-FET T7, which is likewise on, and the "diode" T9. This turns on the word line deactivation transistors T2 connected to the output line AL in order to discharge the associated word lines WL to the deactivation potential $L_L$.

The elements T7, T8, T9 and the potential $H_L$ are proportioned such that the deactivation control signal DSS, produced in response to the deactivation command, on the line AL has a different characteristic than in the previously described normal mode, in order to limit the discharge currents in the turned-on deactivation transistors T2. Current limiting is produced when the final amplitude of the signal DSS is kept below the level which causes the deactivation transistors 2 to be turned on fully. This is achieved by using the potential $H_L$, which is less positive than the H level (e.g. +1.6 Volts), and by the P-FET T9, which is wired up as a diode and on which an additional constant voltage drop at the level of the threshold voltage $V_{th}$ of the P-FET 9 appears (e.g. approximately 0.6 Volts). This raises the deactivation control signal DSS to a level $H_L-V_{th}$ which remains much lower than the H level reached in the normal mode using the transistors T4 and T5. The deactivation transistors 2 thus do not reach their full conductivity and consequently drive a smaller current than in the normal mode. Even the word line exemplars that remained inactive are thus connected at high resistance to the $L_L$ supply line system DL. The ratio of the effective channel resistances of the deactivation transistors T2 to the resistance of the supply line system DL is increased in this manner, which results in that no harmful voltage elevations occur on the inactive word lines as a result of the discharge currents from the active word lines.

Current limiting can also be achieved by reducing the edge gradient of the deactivation control signal DSS. When the rising edge of this signal is steep, the discharge currents flowing via the deactivation transistors T2 from the active word lines WL have a high peak at the start of discharge, which makes a large contribution to the undesirable voltage elevations on the inactive word lines. One particular embodiment of the invention therefore takes a measure to reduce the edge gradient.

In the control circuit 2 shown, this measure includes configuring the circuit path which contains the series-connected FETs T7 and T8 such that it has a perceptible forward resistance when on (higher than the forward resistance of the P-FETs T4 and T5). The higher this resistance, the flatter is the rising edge of the deactivation control signal DSS, on account of the larger RC time constant with the gate ground capacitances of the deactivation transistors T2. The perceptible forward resistance is preferably provided by relatively small proportioning of the P-FETs T7 and T8 (as compared with the proportioning of the P-FETs T4 and T5)

The drawing shows the P-FETs T7 and T8 as transistors with a reduced threshold voltage. The use of such elements can be advantageous within the context of the desired properties of the relevant circuit. Alternatively, transistors without a reduced threshold voltage can be used. In the same sense, it can be advantageous to connect the substrate connections of the transistors T7, T8, T9 to the potential $H_L$, as shown.

The invention is not limited to the control circuit 2 which is described above and is shown in the drawing, and which is only one exemplary embodiment for implementing the inventive concept. Various modifications of the circuit configuration described or alternative embodiments are possible.

Thus, the P-FET T9 wired up as a diode can also be replaced by a real diode; it may also be omitted without replacement if the potential $H_L$ alone is actually low enough to achieve the desired reduction in the final amplitude of the signal DSS. In addition, instead of the potential $H_L$, it is possible to apply the full H level to the end of the relevant current path if the threshold voltage of the P-FET T9 wired up as a diode (or of a diode situated there) alone is sufficient for the level reduction. If desired, a plurality of transistors wired up as diodes (or a plurality of diodes) can be connected in series. The perceptible resistance of the current path for reducing the edge gradient of the signal DSS can also be achieved by inserting an additional resistive element, or by virtue of at least one of the transistors T7 and T8 being turned on only to a limited extent, for example by reducing the turn-on level supplied by the level converter 30. It may also suffice to reduce either only the final amplitude or only the edge gradient of the deactivation control signal DSS.

A general guideline is that, when deactivating a plurality of active word lines, the individual currents flowing from the individual word lines each need to be limited to such an extent that the sum of these currents remains below a critical value. The extent of the current limiting to be set up depends on how many active word lines are to be deactivated at the same time and how high the critical value is. The latter is primarily determined by the configuration-dependent impedance of the supply line system for the deactivation potential. These guidelines form the boundary conditions for setting the current limiting and hence for proportioning the components and levels which are used in the inventive reduction device for current limiting.

We claim:

1. A circuit configuration for deactivating word lines in a memory matrix of a memory, comprising:
   a common supply line system carrying a deactivation potential for the word lines;
   controllable connection devices connected to said common supply line and to be connected to the word lines, said controllable connecting devices connecting each of the word lines to said common supply line system carrying the deactivation potential for the word lines; and
   a control circuit having an output connected to said controllable connection devices, said control circuit receiving a deactivation command and in response to the deactivation command produces a deactivation control signal available at said output, the deactivation control signal turns on said controllable connection devices resulting in turned-on controllable connection devices, said control circuit having a reduction device connected to said output and said reduction device can be switched on selectively and which, when switched on, limits currents flowing through said turned-on controllable connection devices to such an extent that a total current flowing through said common supply line system does not exceed a prescribed value.

2. The circuit configuration according to claim 1, wherein said reduction device contains means for increasing an electrical resistance of said controllable connection devices.

3. The circuit configuration according to claim 2, wherein each of said controllable connection devices has a deactivation transistor with a primary current path connected between one of the word lines and said common supply line system, said deactivation transistor has a control electrode connected to said output of said control circuit and said control electrode receives the deactivation control signal, and said reduction device has means for reducing an amplitude of the deactivation control signal.

4. The circuit configuration according to claim 3, wherein said reduction device has means for reducing a gradient of a leading edge of the deactivation control signal.

5. The circuit configuration according to claim 4, including:
   a first terminal for receiving a first potential;
   a second terminal for receiving a second potential;
   a third terminal for receiving a third potential;
   a first current path connected between said first terminal and said output, said first current path, only when it is on, connects said control electrode of said deactivation transistor to the first potential which turns off said deactivation transistor;
   a second current path connected between said output and said second terminal, said second current path, only when it is on, connects said control electrode of said deactivation transistor to the second potential which drives said deactivation transistor to saturation; and
   a third current path connected between said output and said third terminal, said third current path, only when it is on, connects said control electrode of said deactivation transistor to the third potential for biasing said deactivation transistor in a forward direction, said third current path contains said means for reducing the amplitude and said means for reducing the gradient of the leading edge of the deactivation control signal.

6. The circuit configuration according to claim 5, wherein said means for reducing the amplitude of the deactivation control signal adjusts the third potential by a given value resulting in the deactivation control signal that biases said deactivation transistor in a state having limited conductivity.

7. The circuit configuration according to claim 6, wherein said third current path contains one of a diode and a transistor wired up as a diode having a threshold voltage that is subtracted, when said third current path is on, from the third potential.

8. The circuit configuration according to claim 5, wherein said means for reducing the gradient of the leading edge of the deactivation control signal includes at least one element having a perceptible non-reactive resistance that forms part of said third current path.

9. The circuit configuration according to claim 8, wherein said element with said non-reactive resistance is a primary current path of a transistor which is turned on in order to switch on said third current path.

10. The circuit configuration according to claim 5, wherein said control circuit has a first input for applying a mode setting signal, a second input for applying a binary command signal, and a logic combination device connected to said first input, said second input, said first current path, said second current path and said third current path, said logic combination device keeping only said first current path switched on whenever and only when the binary command signal has a first binary value, said logic combination device keeping said second current path switched on whenever and only when the binary command signal has a second binary value and the mode setting signal has a particular binary value, and said logic combination device switching on only said third current path whenever and only when the binary command signal has the second binary value and the mode setting signal has the binary value other than the particular binary value.

* * * * *